United States Patent
Hsu et al.

(10) Patent No.: US 10,074,499 B2
(45) Date of Patent: Sep. 11, 2018

(54) SYSTEM AND METHOD FOR BLOWING A FUSE

(71) Applicant: NANYA TECHNOLOGY CORPORATION, Taoyuan (TW)

(72) Inventors: Ting-Shuo Hsu, New Taipei (TW); Chih-Jen Chen, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 15/390,961

(22) Filed: Dec. 27, 2016

(65) Prior Publication Data
US 2018/0182588 A1  Jun. 28, 2018

(51) Int. Cl.
| | |
|---|---|
| *H01H 37/76* | (2006.01) |
| *G11C 5/14* | (2006.01) |
| *H01H 85/00* | (2006.01) |
| *G11C 17/16* | (2006.01) |

(52) U.S. Cl.
CPC ......... *H01H 85/0039* (2013.01); *G11C 17/16* (2013.01)

(58) Field of Classification Search
CPC .............................. H01H 85/0039; G11C 17/16
See application file for complete search history.

(56) References Cited

U.S. PATENT DOCUMENTS

| | | | | |
|---|---|---|---|---|
| 5,495,436 A * | 2/1996 | Callahan | ................ | G11C 17/18 327/536 |
| 5,604,694 A * | 2/1997 | Callahan | ................ | G11C 5/145 327/536 |
| 7,656,221 B2 * | 2/2010 | Maejima | ................ | H02M 3/07 327/534 |
| 8,130,026 B2 * | 3/2012 | Maejima | ................ | H02M 3/07 327/534 |
| 8,223,576 B2 * | 7/2012 | Yang | ................... | G11C 11/4074 365/189.07 |
| 8,456,942 B2 * | 6/2013 | Yang | ................... | G11C 11/4074 365/189.07 |
| 8,699,247 B2 * | 4/2014 | Nguyen | ................ | G11C 5/145 327/536 |
| 9,466,391 B2 * | 10/2016 | Hong | .................... | G11C 17/16 |

* cited by examiner

*Primary Examiner* — Kenneth B Wells
(74) *Attorney, Agent, or Firm* — Muncy, Geissler, Olds & Lowe, P.C.

(57) ABSTRACT

A system includes a fuse pump; a fuse that can be blown by the fuse pump; and a voltage source configured to provide a first voltage only if the fuse pump is enabled to blow the fuse, the fuse pump blowing the fuse when the first voltage serves as a supply voltage of the fuse pump. If the first voltage serves as a supply voltage of the fuse pump, a first consumed time is required to blow the fuse. If a second voltage, provided by the voltage source, were to be served as a supply voltage of the fuse pump, a second consumed time is required to blow the fuse. The first consumed time is less than the second consumed time.

9 Claims, 5 Drawing Sheets

SYSTEM AND METHOD FOR BLOWING A FUSE

TECHNICAL FIELD

The present disclosure relates to a fuse pump, and more particularly, to a fuse pump receiving a relatively higher supply voltage.

DISCUSSION OF THE BACKGROUND

With the development of miniaturized memory elements and the complexity of fabrication processes, the memory elements are easily affected by various defects. Currently, fuses and e-fuses are mostly applied to repair methods for solving the problems caused by the various defects, and both of them relate to complex repair methods.

This Discussion of the Background section is provided for background information only. The statements in this Discussion of the Background are not an admission that the subject matter disclosed in this section constitutes prior art to the present disclosure, and no part of this section may be used as an admission that any part of this application, including this Discussion of the Background section, constitutes prior art to the present disclosure.

SUMMARY

One aspect of the present disclosure provides a system. The system includes a fuse pump; a fuse that can be blown by the fuse pump; and a voltage source configured to provide a first voltage only if the fuse pump is enabled to blow the fuse, the fuse pump blowing the fuse when the first voltage serves as a supply voltage of the fuse pump. If the first voltage serves as a supply voltage of the fuse pump, a first consumed time is required to blow the fuse. If a second voltage, provided by the voltage source, were to be served as a supply voltage of the fuse pump, a second consumed time is required to blow the fuse. The first consumed time is less than the second consumed time.

In some embodiments, when the voltage source provides the second voltage, the fuse pump is disabled from blowing the fuse.

In some embodiments, the voltage source is further configured to provide a third voltage greater than the first voltage as a supply voltage of the fuse pump only if the fuse pump is enabled to blow the fuse.

In some embodiments, wherein if the third voltage serves as a supply voltage of the fuse pump, a third consumed time is required to blow the fuse, wherein the third consumed time is less than the first consumed time.

Another aspect of the present disclosure provides a system. The system includes a fuse pump; a fuse that can be blown by the fuse pump; an electronic device; and a voltage source configured to provide a first voltage as a supply voltage of the fuse pump only if the fuse pump is enabled to blow the fuse, and configured to provide a second voltage as a supply voltage of the electronic device when the fuse pump is disabled from blowing the fuse, wherein the first voltage is higher than the second voltage.

In some embodiments, the function of electronic device is different from the function of the fuse pump.

In some embodiments, when the voltage source provides the first voltage as a supply voltage of the fuse pump, the electronic device is disabled.

In some embodiments, when the voltage source provides the second voltage as a supply voltage of the electronic device, the fuse pump is disabled from blowing the fuse.

Another aspect of the present disclosure provides a method. The method includes providing a first voltage by a voltage source only if a fuse pump is enabled to blow a fuse; and blowing the fuse by the fuse pump when the first voltage serves as a supply voltage of the fuse pump, wherein if the first voltage serves as a supply voltage of the fuse pump, a first consumed time is required to blow the fuse, and if a second voltage, provided by the voltage source, were to be served as a supply voltage of the fuse pump, a second consumed time is required to blow the fuse, wherein the first consumed time is less than the second consumed time.

In some embodiments, the method further includes providing the second voltage by the voltage source only if the fuse pump is disabled from blowing the fuse.

In some embodiments, the method further includes providing a third voltage, which is higher than the first voltage as a supply voltage of the fuse pump only if the fuse pump is enabled to blow the fuse.

In some embodiments, if the third voltage serves as a supply voltage of the fuse pump, a third consumed time is required to blow the fuse, wherein the third consumed time is less than the first consumed time.

In some existing approaches, a fuse pump is provided which receives a relatively low voltage and the relatively low voltage serves as the supply voltage of the fuse pump. The fuse pump provides a relatively lower current to blow a fuse, and a longer time is required to blow the fuse, such that a blowing state of the fuse turns into a desired blowing state. Correspondingly, in a given time that is less than the longer time required to blow the fuse under the relatively low voltage, the blowing state of the fuse might not be blown as the desired blowing state. As such, an integrated circuit or an electronic device coupled to the fuse might not receive the appropriate voltage, and therefore might not work normally.

In the present disclosure, the first voltage is relatively high. Accordingly, a relatively short time is required under the first voltage to achieve the desired blowing state of the fuse. Therefore, in the given time mentioned above, a blowing state of the fuse may achieve the desired blowing state.

In some existing systems, a voltage source may provide a single and relatively low voltage to individual circuits in a memory circuit. A fuse pump might take a relatively long time to blow a fuse, such that a blowing state of the fuse turns into a desired blowing state when the fuse pump receives the relatively low voltage. If the relatively low voltage is increased to reduce the time required to blow the fuse, the individual circuit may work abnormally or be damaged under such increased voltage.

In contrast, in the present disclosure, the voltage source provides the relatively high voltage to the fuse pump only when a fuse-blowing operation performed by the fuse pump is to be performed. At the time of performing the fuse-blowing operation, the electronic device is disabled to prevent the electronic device from working abnormally or being damaged.

The foregoing has outlined rather broadly the features and technical advantages of the present disclosure in order that the detailed description of the disclosure that follows may be better understood. Additional features and advantages of the disclosure are described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
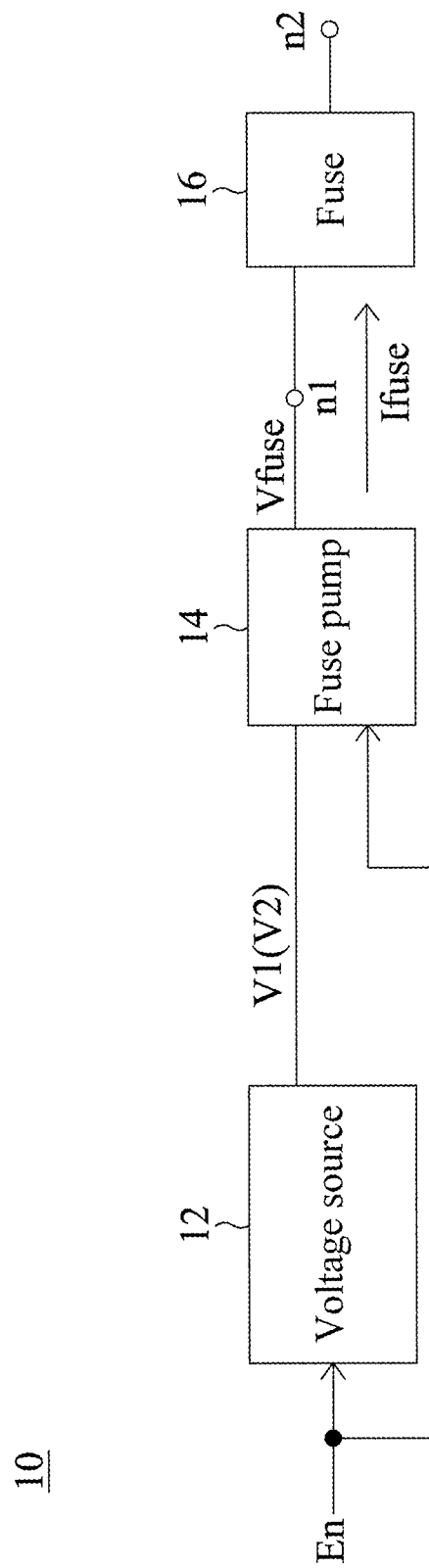
FIG. 1 is a block diagram of a system in accordance with some embodiments of the present disclosure.

Embodiments, or examples, of the disclosure illustrated in the drawings are now described using specific language. It shall be understood that no limitation of the scope of the disclosure is thereby intended. Any alteration or modification to the described embodiments, and any further applications of principles described in this document, are to be considered as normally occurring to one of ordinary skill in the art to which the disclosure relates. Reference numerals may be repeated throughout the embodiments, but this does not necessarily require that feature(s) of one embodiment apply to another embodiment, even if they share the same reference numeral.

It shall be understood that when an element is referred to as being "connected to" or "coupled with" another element, it may be directly connected to or coupled to the other element, or intervening elements may be present.

It shall be understood that, although the terms first, second, third, etc. may be used herein to describe various elements, components, regions, layers or sections, these elements, components, regions, layers or sections should not be limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It shall be further understood that the terms "comprises" and "comprising," when used in this specification, specify the presence of stated features, integers, steps, operations, elements, or components, but do not preclude the presence or addition of one or more other features, integers, steps, operations, elements, components, or groups thereof.

FIG. 1 is a block diagram of a system 10 in accordance with some embodiments of the present disclosure. Referring to FIG. 1, the system 10 includes a voltage source 12, a fuse pump 14, and a fuse 16 that can be blown by the fuse pump 14.

The voltage source 12 functions to provide one of a first voltage V1 and a second voltage V2. In further detail, the voltage source 12 functions to, in response to an enable signal En, provide the first voltage V1. The first voltage V1 serves as a supply voltage of the fuse pump 14. In contrast, if the voltage source 12 does not receive the enable signal En, the voltage source 12 provides the second voltage V2 rather than the first voltage V1. The first voltage V1 is higher than the second voltage V2. Additionally, the second voltage V2 does not serve as a supply voltage of the fuse pump 14. In an embodiment, the voltage source 12 includes a boost converter, a buck converter, or any suitable regulator.

In response to the enable signal En, the fuse pump 14 is enabled to blow the fuse 16. In contrast, if the fuse pump 14 does not receive the enable signal En, the fuse pump 14 is disabled from blowing the fuse 16. The voltage source 12 provides the second voltage V2 when the voltage source 12 does not receive the enable signal En; accordingly, the fuse pump 14 is disabled from blowing the fuse 16 when the voltage source 12 provides the second voltage V2.

In operation, if the first voltage V1 serves as a supply voltage of the fuse pump 14, a first consumed time is required to blow the fuse 16. The term "blow" refers to the event wherein the fuse 16 serves as a switch; prior to the "blowing" event, the switch is not conductive, such that a voltage at node n1 is not equal to that at node n2, and after the "blowing" event, the switch is conductive and the voltage at node n1 is equal to that at node n2. Alternatively, the term "blow" refers to the event wherein after the "blowing" event, a voltage at node n2 is desired and appropriate.

For clarity of explanation, a hypothetical scenario is discussed below. If the second voltage V2, provided by the voltage source 12, were to be used as a supply voltage of the fuse pump 14 (actually as previously mentioned, the second voltage V2 does not serve as the supply voltage of the fuse pump 14), a second consumed time would be required to blow the fuse 16. The second consumed time is longer than the first consumed time. In further detail, if the second voltage V2 were to serve as a supply voltage of the fuse pump 14, because the second voltage V2 is lower than the first voltage V1, the fuse pump 14 would provide a relatively low current to blow the fuse 16. As such, it would take longer to blow the fuse 16 under the second voltage V2 than under the first voltage V1. For example, to achieve the same blowing state, if the second voltage V2 were to serve as a supply voltage of the fuse pump 14, the second consumed time would be 10 microseconds. In contrast, if the first voltage V1 serves as a supply voltage of the fuse pump 14, the first consumed time may be 5 microseconds.

In operation, the voltage source 12 provides the first voltage V1 as a supply voltage of the fuse pump 14 only if the fuse pump 14 is enabled to blow the fuse 16. As such, the fuse pump 14 blows the fuse 16 when the first voltage V1 serves as a supply voltage of the fuse pump 14. In further detail, the voltage source 12 receives the enable signal En. Accordingly, the voltage source 12 provides the first voltage V1 as a supply voltage of the fuse pump 14. The fuse pump 14 receives the enable signal En and the first voltage V1. The fuse pump 14 receiving the first voltage V1 then blows the fuse 16 in response to the enable signal En.

In some existing approaches, a fuse pump receives a relatively low voltage (such as the second voltage V2) as its supply voltage. As such, the fuse pump provides a relatively low current to blow a fuse. Under such relatively low current, a relatively long time is needed to blow the fuse, such that a blowing state of the fuse turns into a desired blowing state. Correspondingly, in a given time that is less than the relatively long time, the blowing state of the fuse might not achieve the desired blowing state. Accordingly, an integrated circuit or an electronic device coupled to the fuse (for example, coupled to the fuse 16 at node 2) might not receive the appropriate voltage, and therefore might not function normally.

In the present disclosure, the first voltage V1 is relatively high. Therefore, a relatively short time is required to achieve the desired blowing state of the fuse 16. Therefore, in the given time, a blowing state of the fuse 16 may achieve the desired blowing state.

Figure 2:
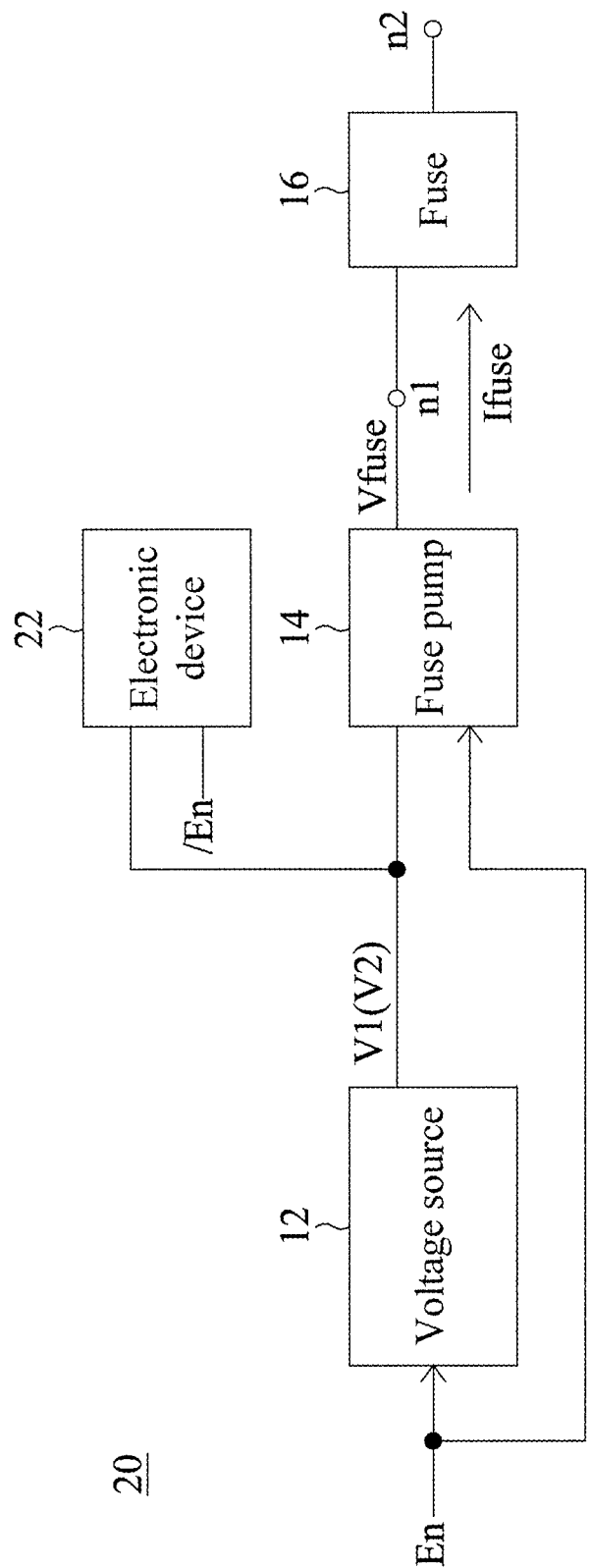
FIG. 2 is a block diagram of another system in accordance with some embodiments of the present disclosure.

FIG. 2 is a block diagram of another system 20 in accordance with some embodiments of the present disclosure. Referring to FIG. 2, the system 20 is similar to the system 10 described and illustrated with reference to FIG. 1 except that, for example, the system 20 includes an electronic device 22 and the voltage source 12 serves as a global voltage source of the system 20.

The electronic device 22 functions differently from the fuse pump 14, and therefore the electronic device 22 does not function to blow the fuse 16. The electronic device 22 may be any circuit in a memory circuit. The electronic device 22 is disabled in response to a disable signal /En. The disable signal /En is functionally opposite to the signal En. For example, when the enable signal En is in a logical high state, the disable signal /En is in a logical low state, and vice versa. Moreover, the disable signal /En may be obtained by inputting the enable signal En to an inverter. In further detail, when the electronic device 22 is, in response to the disable signal /En, to be disabled, the fuse pump 14 is, in response to the enable signal En, to be enabled to blow the fuse 14.

In operation, when the voltage source 12, in response to the enable signal En, provides the first voltage V1 as a supply voltage of the fuse pump 14, the electronic device 22 is, in response to the disable signal /En, disabled. In contrast, when the voltage source 12 provides the second voltage V2 as a supply voltage of the electronic device 22, the fuse pump 14 is disabled from blowing the fuse 16.

In some existing systems, a voltage source (such as the voltage source 12) may provide a single and relatively low voltage (such as the second voltage V2) to individual circuits in a memory circuit. A fuse pump that receives the relatively low voltage might take a relatively long time to blow a fuse, such that a blowing state of the fuse turns into a desired blowing state when the fuse pump 14 receives the relatively low voltage. If the relatively low voltage is increased to reduce the consumed time to blow the fuse, the individual circuit may work abnormally or be damaged under such relatively high voltage.

In contrast, in the present disclosure, the voltage source 12 provides the relatively high voltage V1 to the fuse pump 14 only when a fuse-blowing operation performed by the fuse pump 14 is to be performed. At the time of performing the fuse-blowing operation, the electronic device 22 is disabled to prevent the electronic device 22 from working abnormally or being damaged.

Figure 3:
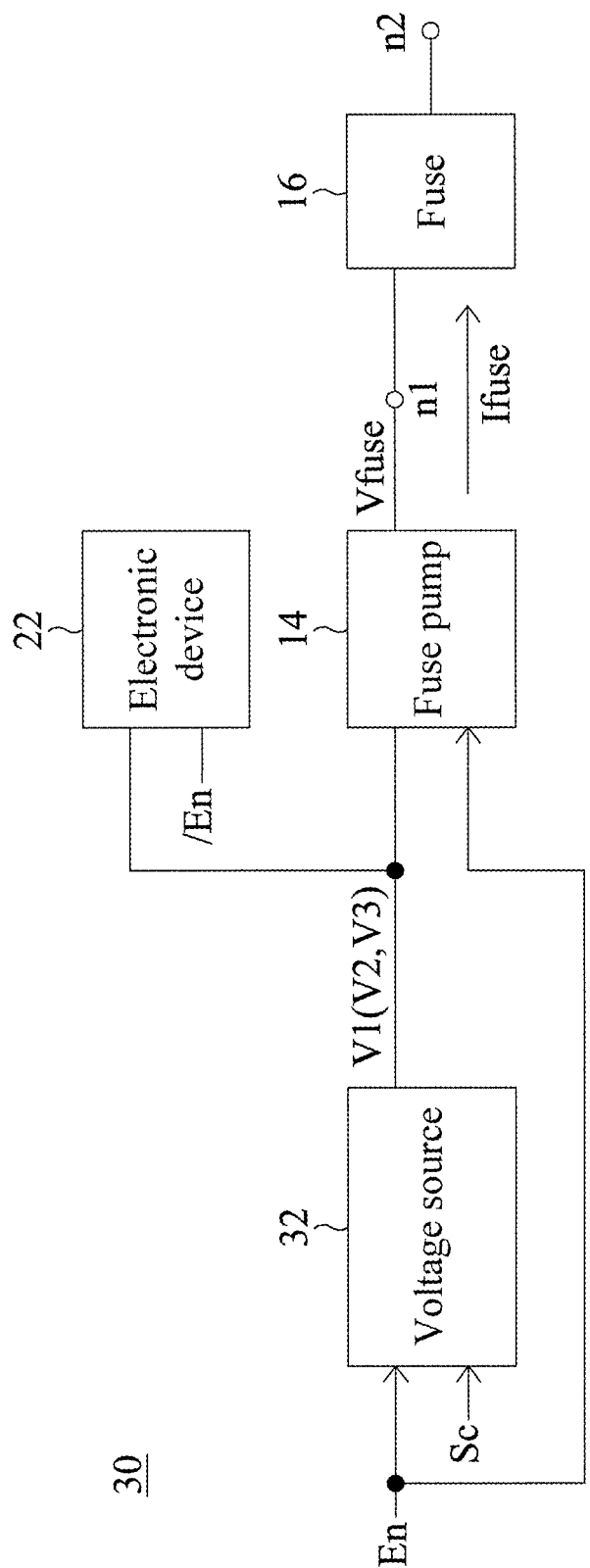
FIG. 3 is a block diagram of yet another system in accordance with some embodiments of the present disclosure.

FIG. 3 is a block diagram of yet another system 30 in accordance with some embodiments of the present disclosure. Referring to FIG. 3, the system 30 is similar to the system 20 described and illustrated with reference to FIG. 2 except that, for example, the system 30 includes a voltage source 32.

When the voltage source 32, in response to the enable signal EN, provides a voltage as a supply voltage of the fuse pump 14, the voltage source 32 also, in response to a selection signal Sc, provides one of the first voltage V1 and a third voltage V3 as the supply voltage of the fuse pump 14. That is, the voltage source 32 provides the third voltage V3 as a supply voltage of the fuse pump 14 only if the fuse pump 14 is enabled to blow the fuse 16.

The third voltage V3 is higher than the first voltage V1. For the reason similar to that discussed above, if the third voltage V3 serves as a supply voltage of the fuse pump 14, a third consumed time is required to blow the fuse 16. The third consumed time is less than the first consumed time.

Figure 4:
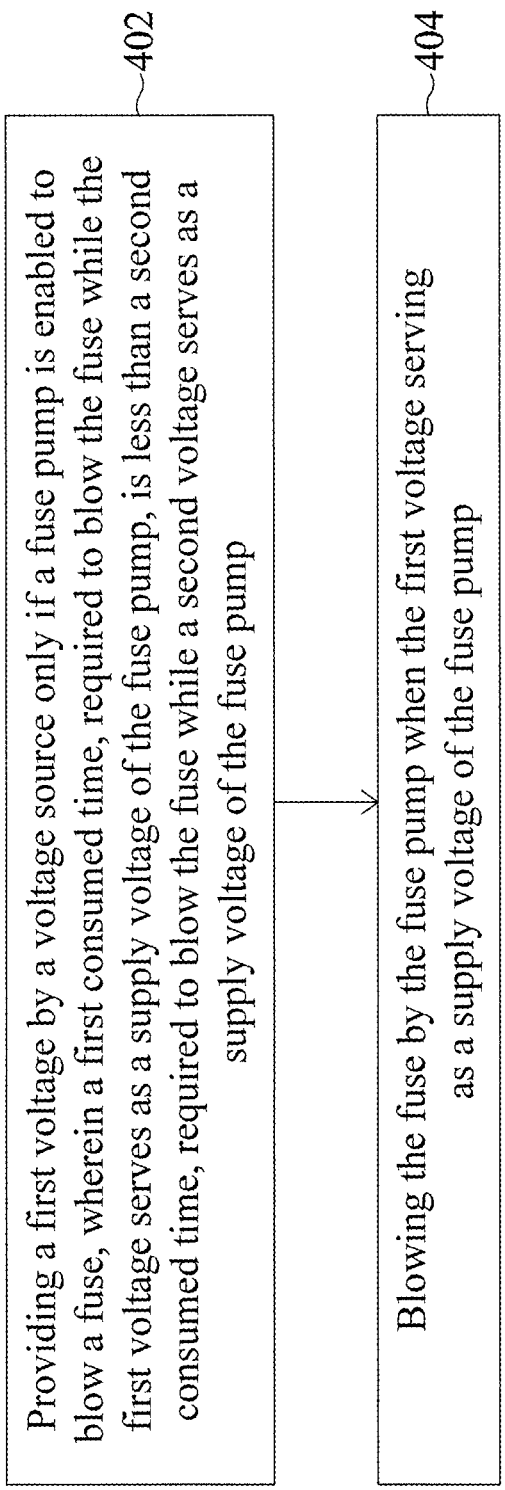
FIG. 4 is a flow chart illustrating a method of providing a relatively high voltage to a fuse pump in accordance with some embodiments of the present disclosure.

FIG. 4 is a flow chart illustrating a method 40 of providing a relatively high voltage to a fuse pump in accordance with some embodiments of the present disclosure. Referring to FIG. 4, the method 40 begins with operation 402, in which a first voltage is provided by a voltage source only if a fuse pump is enabled to blow a fuse. A first consumed time, required to blow the fuse while the first voltage serves as a supply voltage of the fuse pump, is less than a second consumed time, required to blow the fuse while a second voltage serves as a supply voltage of the fuse pump.

The method 40 then continues with operation 404, in which the fuse pump blows the fuse when the first voltage serves as a supply voltage of the fuse pump.

The method 40 is merely an example, and is not intended to limit the present disclosure beyond what is explicitly recited in the claims. Additional operations can be provided before, during, and after the method 40, and some operations described can be replaced, eliminated, or moved around for additional embodiments of the method.

Figure 5:
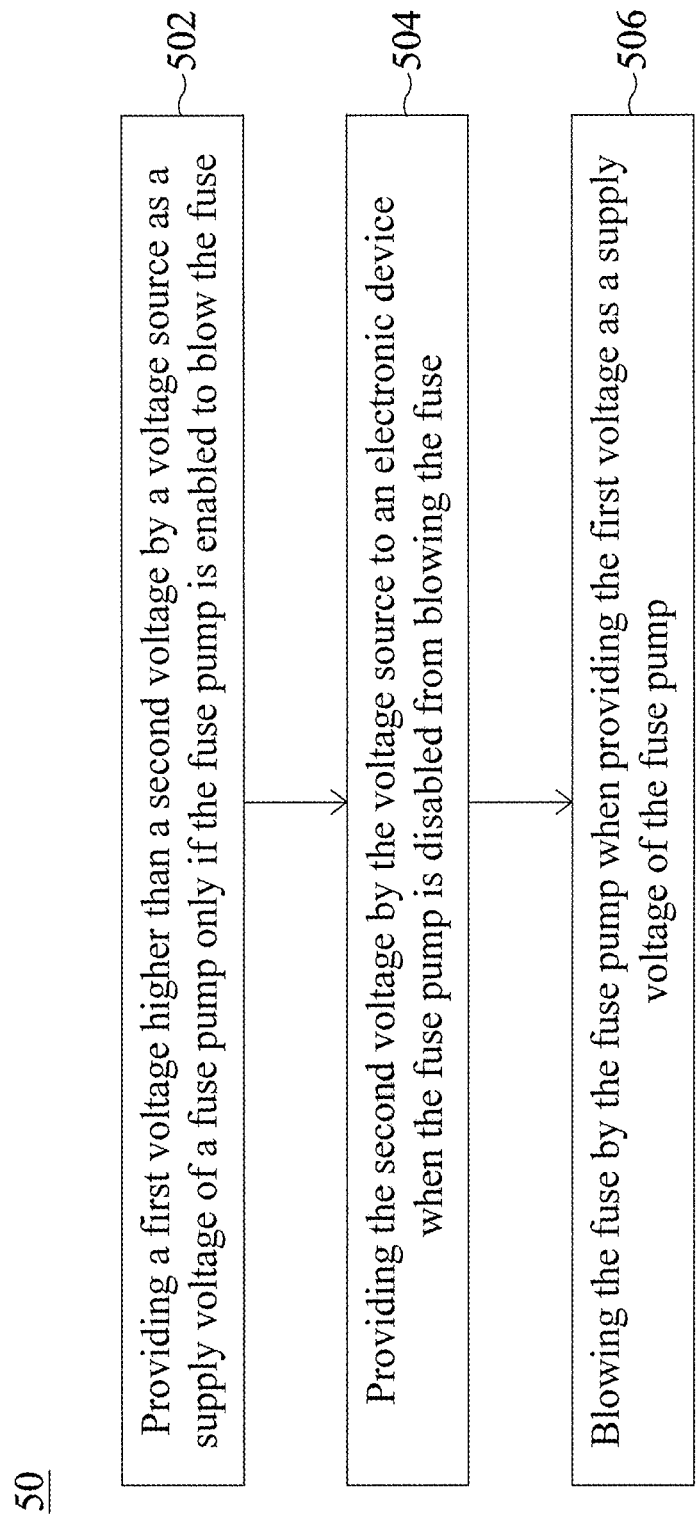
FIG. 5 is a flow chart illustrating another method of providing a relatively high voltage to a fuse pump in accordance with some embodiments of the present disclosure.

FIG. 5 is a flow chart illustrating a method 50 of providing a relatively high voltage to a fuse pump in accordance with some embodiments of the present disclosure. Referring to FIG. 5, the method 50 begins with operation 502, in which a voltage source provides a first voltage higher than a second voltage as a supply voltage of a fuse pump only if the fuse pump is enabled to blow the fuse.

The method 50 then continues with operation 504, in which the voltage source provides the second voltage to an electronic device when the fuse pump is disabled from blowing the fuse.

The method 50 proceeds with operation 506, in which the fuse pump blows the fuse when the first voltage is provided as a supply voltage of the fuse pump.

The method 50 is merely an example, and is not intended to limit the present disclosure beyond what is explicitly recited in the claims. Additional operations can be provided before, during, and after the method 50, and some operations described can be replaced, eliminated, or moved around for additional embodiments of the method.

In some existing approaches, a fuse pump is provided a relatively low voltage, such as the second voltage V2, and the relatively low voltage serves as the supply voltage of the fuse pump. The fuse pump provides a relatively lower current to blow a fuse, and a longer time is required to blow the fuse, such that a blowing state of the fuse turns into a desired blowing state. Correspondingly, in a given time that is less than the longer time required to blow the fuse under the second voltage V2, the blowing state of the fuse might not be blown as the desired blowing state. As such, an integrated circuit or an electronic device coupled to the fuse (for example, coupled to the fuse 16 at node 2) might not receive the appropriate voltage, and therefore might not work normally.

In the present disclosure, the first voltage V1 is relatively high. Accordingly, a relatively short time is required under the first voltage V1 to achieve the desired blowing state of the fuse 16. Therefore, in the given time mentioned above, a blowing state of the fuse 16 may achieve the desired blowing state.

In some existing systems, a voltage source (such as the voltage source 12) may provide a single and relatively low voltage (such as the second voltage V2) to individual circuits in a memory circuit. A fuse pump might take a relatively long time to blow a fuse, such that a blowing state of the fuse turns into a desired blowing state when the fuse pump receives the relatively low voltage. If the relatively low voltage is increased to reduce the time required to blow the fuse, the individual circuit may work abnormally or be damaged under such increased voltage.

In contrast, in the present disclosure, the voltage source 12 provides the relatively high voltage V1 to the fuse pump 14 only when a fuse-blowing operation performed by the fuse pump 14 is to be performed. At the time of performing the fuse-blowing operation, the electronic device 22 is disabled to prevent the electronic device 22 from working abnormally or being damaged.

Some embodiments have one or a combination of the following features or advantages. In some embodiments, a system is provided. The system includes a fuse pump; a fuse that can be blown by the fuse pump; and a voltage source configured to provide a first voltage only if the fuse pump is enabled to blow the fuse, the fuse pump blowing the fuse when the first voltage serves as a supply voltage of the fuse pump. If the first voltage serves as a supply voltage of the fuse pump, a first consumed time is required to blow the fuse. If a second voltage, provided by the voltage source, were to be served as a supply voltage of the fuse pump, a second consumed time is required to blow the fuse. The first consumed time is less than the second consumed time.

In some embodiments, a system is provided. The system includes a fuse pump; a fuse that can be blown by the fuse pump; an electronic device; and a voltage source configured to provide a first voltage as a supply voltage of the fuse pump only if the fuse pump is enabled to blow the fuse, and configured to provide a second voltage as a supply voltage of the electronic device when the fuse pump is disabled from blowing the fuse, wherein the first voltage is higher than the second voltage.

In some embodiments, a method is provided. The method includes providing a first voltage by a voltage source only if a fuse pump is enabled to blow a fuse; and blowing the fuse by the fuse pump when the first voltage serves as a supply voltage of the fuse pump, wherein if the first voltage serves as a supply voltage of the fuse pump, a first consumed time is required to blow the fuse, and if a second voltage, provided by the voltage source, were to be served as a supply voltage of the fuse pump, a second consumed time is required to blow the fuse, wherein the first consumed time is less than the second consumed time.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system, comprising:
   a fuse pump;
   a fuse that can be blown by the fuse pump; and
   a voltage source configured to provide a first voltage and a second voltage;
   wherein if the voltage source and the fuse pump receive an enable signal, the voltage source provides the first voltage as a supply voltage to the fuse pump and the fuse pump is enabled to blow the fuse,
   wherein if the voltage source and the fuse pump do not receive the enable signal, the voltage source provides the second voltage as the supply voltage of the fuse pump and the fuse pump is disabled from blowing the fuse, and
   wherein the first voltage is higher than the second voltage.

2. The system of claim 1, wherein the voltage source is further configured to provide a third voltage higher than the first voltage as the supply voltage of the fuse pump only if the fuse pump is enabled to blow the fuse.

3. The system of claim 2, wherein if the third voltage serves as the supply voltage of the fuse pump, a third consumed time is required to blow the fuse, wherein the third consumed time is less than the first consumed time.

4. A system, comprising:
   a fuse pump;
   a fuse that can be blown by the fuse pump;
   an electronic device; and
   a voltage source configured to provide a first voltage as a first supply voltage of the fuse pump and a second voltage as a second supply voltage of the electronic device,
   wherein if the voltage source and the fuse pump receive an enable signal and the electronic device receives a disable signal, the voltage source provides the first voltage to the fuse pump and the fuse pump is enabled to blow the fuse; if the voltage source and the fuse pump do not receive the enable signal and the electronic device does not receive the disable signal, the voltage source provides the second voltage to the electronic device and the fuse pump is disabled from blowing the fuse,
   wherein the first voltage is higher than the second voltage.

5. The system of claim 4, wherein the function of the electronic device is different from that of the fuse pump.

6. The system of claim 4, wherein when the voltage source provides the first voltage as the supply voltage of the fuse pump, the electronic device is disabled.

7. A method, comprising:
providing a first voltage to a fuse pump by a voltage source and enabling the fuse pump to blow a fuse only if the voltage source and the fuse pump receive an enable signal;
blowing the fuse by the fuse pump when the first voltage serves as a supply voltage of the fuse pump;
providing a second voltage by the voltage source and disabling the fuse pump from blowing the fuse only if the voltage source and the fuse pump do not receive the enable signal,
wherein the first voltage is higher than the second voltage.

8. The method of claim 7, further comprising:
providing a third voltage higher than the first voltage as the supply voltage of the fuse pump only if the fuse pump is enabled to blow the fuse.

9. The method of claim 8, wherein if the third voltage serves as the supply voltage of the fuse pump, a third consumed time is required to blow the fuse, wherein the third consumed time is less than the first consumed time.

* * * * *